United States Patent
Hughes et al.

(10) Patent No.: US 6,287,969 B1
(45) Date of Patent: Sep. 11, 2001

(54) METHOD OF FORMING A SUPERCONDUCTOR

(75) Inventors: Robert A. Hughes; Patrick J. Turner, both of Hamilton; John S Preston, Dundas, all of (CA)

(73) Assignee: McMaster University, Ontario (CA)

(*) Notice: Subject to any disclaimer, the term of this patent is extended or adjusted under 35 U.S.C. 154(b) by 0 days.

(21) Appl. No.: 09/306,310

(22) Filed: May 6, 1999

(51) Int. Cl.$^7$ .................................................. H01L 21/44
(52) U.S. Cl. ........................... 438/687; 438/226; 257/33; 505/330
(58) Field of Search ..................................... 438/226, 300, 438/341, 357, 356, 363, 413, 416, 429, 601; 257/592, 929

(56) References Cited

U.S. PATENT DOCUMENTS

| | | |
|---|---|---|
| 4,486,464 | 12/1984 | Young . |
| 4,728,626 | 3/1988 | Tu . |
| 5,030,613 | 7/1991 | Chai . |
| 5,236,896 | 8/1993 | Nakamura . |
| 5,322,526 | 6/1994 | Nakamura . |
| 5,326,988 | 7/1994 | Ishada . |
| 5,347,086 | 9/1994 | Potter . |
| 5,388,068 | 2/1995 | Ghosal . |
| 5,399,546 | 3/1995 | Nakamura . |
| 5,407,903 | 4/1995 | Nakamura . |
| 5,413,982 | 5/1995 | Inada . |
| 5,416,072 | 5/1995 | Inada . |
| 5,420,101 | 5/1995 | Copetti . |
| 5,434,127 | 7/1995 | Nakamura . |
| 5,439,875 | 8/1995 | Tanaka . |
| 5,446,015 | 8/1995 | Nakamura . |
| 5,466,664 | 11/1995 | Inada . |
| 5,506,197 | 4/1996 | Nakamura . |
| 5,547,923 | 8/1996 | Nakamura . |
| 5,906,965 | * 5/1999 | Rao ........................................ 505/470 |
| 5,985,404 | * 11/1999 | Yano et al. ........................... 428/65.3 |
| 6,023,072 | * 2/2000 | Silver ..................................... 257/33 |

FOREIGN PATENT DOCUMENTS

DE 196 34 463 A1   8/1996 (DE) .

OTHER PUBLICATIONS

Whorls Upon Whorls L. Garwin Nature vol. 350 Mar. 28, 1991 p.277—1 page .
Screw Dislocations in High–T Films C.Garber et al Nature vol. 350 Mar. 28, 1991–13 2 pages.

(List continued on next page.)

Primary Examiner—David Nelms
Assistant Examiner—Dung A. Le
(74) Attorney, Agent, or Firm—Thomas A O'Rourke; Wyatt Gerber & O'Rourke

(57) ABSTRACT

Disclosed herein is a method of forming a superconductor, comprising the steps of: providing a substrate and exposing the substrate to a first atmosphere, including precursors to form a first epitaxial layer segment. The first layer segment is then exposed to a second atmosphere, including precursors to form a second epitaxial layer segment, and the second layer segment is exposed to a third atmosphere including precursors to form a third epitaxial layer segment. Each of the first and third layer segments are each formed from a superconductor material and the second layer segment is formed from a material different from the first and third layer segments and the first, second and third layer segments have a collective thickness, the third layer segment having an outer surface with a roughness which is less than that of a single layer of the superconductor material with a thickness equal to the collective thickness.

24 Claims, 8 Drawing Sheets

OTHER PUBLICATIONS

Molecular beam . . . surface roughness—W.Schindler et al Thin Solid Films, 250 (1994) Elsevier Sci. S.A. 6 pages.
Internet U.S. Patent 5,589,284, Summerfelt et al. Dec. 31, 1996—5 pages.
Internet U.S. Patent 5,585,330, Cadotte, Jr. et.al. Dec. 17, 1996—2 pages.
Internet U.S. Patent 5,585,300, Summerfelt Dec. 17, 1996—4 pages.
Internet U.S. Patent 5,538,941, Findikoglu, et.al. Jul. 23, 1996—2 pages.
Internet U.S. Patent 5,449,659, Garrison, et.al. Sep. 12, 1995—2 pages.
Internet U.S. Patent 5,219,827, Higaki, et.al. Jun. 15, 1993—2pages.
Internet U.S. Patent 5,098,178, Ortbasi Mar. 24, 1992—4 pages.
Database Search Jan. 29, 1997 16:18:59 5 pages.
Database Search Jan. 29, 1997 17:20:20 5 pages.
3.2.2 Growth Mechanism, Internet, T. Shimizu—4 pages.
High Temperature Superconductors, Internet—5 pages.
High Quality Y . . . films . . . vapor deposition H.Busch et al. J.Appl.Phys.70(4).Aug. 15,1991—3 pages.
New Research Opp.in Supercond IV* B.J.Batlogg et al. Jnl.of Superconductivity V.10 No.6 1997—39 pages.
Dependence of Crystalline . . . laser ablated . . . A.H.Carim et al,Appl.Phys.Lett.58(8) Feb. 25, 1991—3 pages.
Surface Mechanics—Chapter 8 p.173–191 F.Fongsulung Ref. Thode TA 418.7.L55—18 pages.
Growth Mechanism . . . Tunneling Microscopy M.Hawley et al.Reports:Sci.vol.251 Mar. 29, 1991—3 pages.
Measurements . . . Superconductors—A.Kapitulnik & K.Char IBM J.Res.Develop. vol. 33 No.3 May 1989—10 pages.
The formation . . . surface resistance—S.F.Karmanenot et al.Supercond.Sci Technol.6 (1993) 23–29 7 pages.
Substrate temperature . . . pulsed–laser ablation B.L.Low et al.Supercond.Sci Technol.10 (1997) 6 pages.
Reproducible sputtering . . . various thicknesses F.E.Luborsky et al.J.Appl.Phys.64(11)Dec. 1,1988—4 pages.
Handbook of Thin Film Technology—Maissel & Glang McGraw Hill p.6–13 to 6–17 Ref TK.7821.15.T5H34—6 pages.
Metalorganic Chemical . . . superconducting films S.Matsuno et al Appl.Phys Lett.60(19)May 11,1992—3 pages.
Topical Review–High–temperature . . . thick films N.McNalford et al.Supercond.Sci Technol 10(1997) 17 pages.
Film Thickness . . . Partial Pressure—A.Mogro–Campero and L.G.Turner Jnl Supercond. vol. 6 No.2 1993—5 pages.
Film Thickness . . . Films—A.Mogro–Campero et al 0953–20481901020062+05–1990 IOP Publ—5 pages.
Review—High–Temperature . . . and Engineering—N.Newman & W.G.Lyons Jnl Supercond vol. 6 No. 3 1993—27 pages.
Surface Resistance . . . Thickness—F.J.B.Stork et al Transactions Appl.Supercond vol. 7 No.2 Jun. 1997 4 pages.
Atomic Scale . . . Surface—M.Tonouchi et al Supercond. Sci.Technol.9(1996) A161–A165—5 pages.
A Two–Layer Simulation . . . Resistance O.G. Vendik et al.Physics C.179 (1991) p.91–95—5 pages.
Current Limiting . . . Substrates—R.Wordenweber et al. IEEE Transactions Appl.Supercond vol. 7 No.2,Jun. 1997—4 pages.
Dependence . . . Thin Films—S.F.Xu et al Jnl Supercond vol. 8 No.2 1995—5 pages.
Database Search Jan. 29, 1997 15:09:27 14 pages.
Database Search Jan. 29, 1997 14:44:55 13 pages.

* cited by examiner

UX 10:1

Nanoscope II
Parameters:
Z    90.0 A/U
XY   314.4 A/U
Samples  400/scan

Buffer 1(HEG33), Rotated 0°, XY axes [nm], Z axis [nm]

Fig A
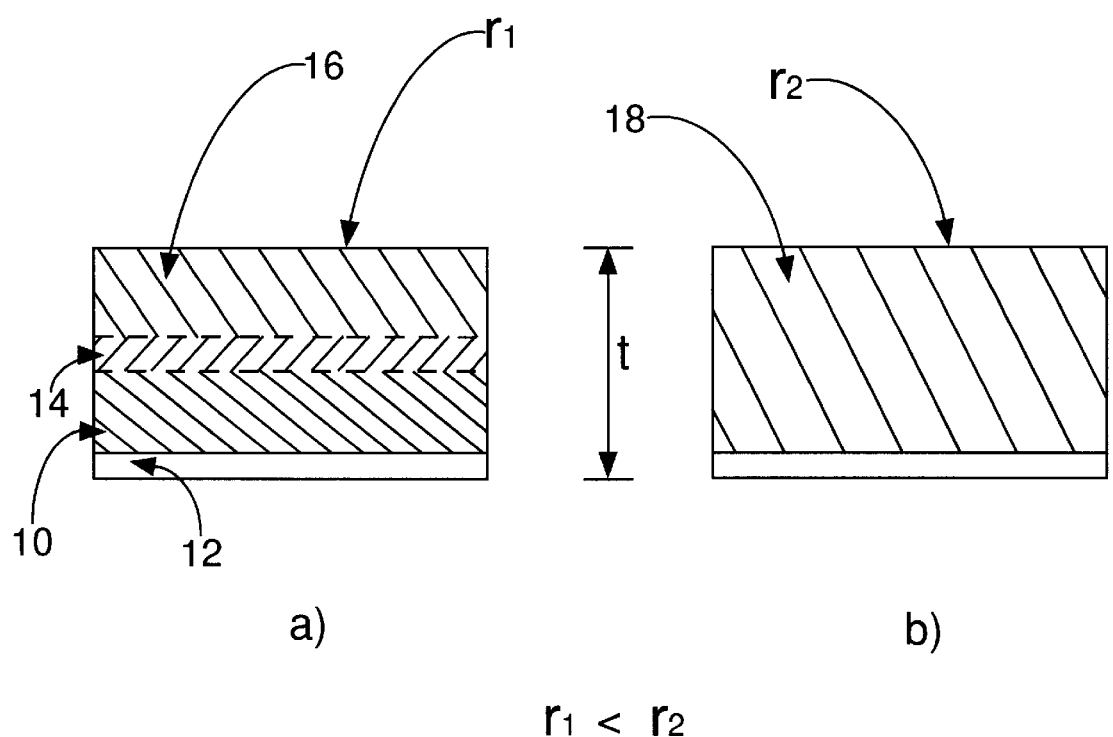
a)          b)
$r_1 < r_2$

YBCO 500 angstrom,    UX 10:1

Nanoscope II
Parameters:
Z    90.0 A/U
XY   314.4 A/U
Samples  400/scan

Buffer 4(HEG014), Rotated 0°, XY axes [nm], Z axis [nm]

| | | | | |
|---|---|---|---|---|
| Ra [nm] | 2.39 | lc [nm] 3333 | | Spectral period [nm] |
| Rmax [nm] | 23.99 | L [nm] 9950 | | 3333 |
| Rz [nm] | 15.01 | | | |

UX 10:1

ZOOM 4:1

Buffer 1(HEG33), Rotated 0°, XY axes [nm], Z axis [nm]

| | | |
|---|---|---|
| Ra [nm] 9.30 | 1c [nm] 3333 | Spectral period [nm] |
| Rmax [nm] 82.76 | L [nm] 9950 | 3333 |
| Rz [nm] 55.18 | | |

YBCO 5000 angstrom

ZOOM 4:1

Buffer 4(HEG014), Rotated 0°, XY axes [nm], Z axis [nm]

| Ra [nm] | 9.85 | lc [nm] 3333 | Spectral period [nm] |
|---|---|---|---|
| Rmax [nm] | 110.35 | L [nm] 9950 | 3333 |
| Rz [nm] | 61.10 | | |

ZOOM 4:1

Buffer 2(HEG019A), Rotated 0°, XY axes [nm], Z axis [nm]

Ra [nm]   38.74         lc [nm] 3333        Spectral period [nm]
Rmax [nm] 234.86        L [nm] 9950         3333
Rz [nm]   177.67

ZOOM 4:1

Buffer 3(HEG024A), Rotated 0°, XY axes [nm], Z axis [nm]

METHOD OF FORMING A SUPERCONDUCTOR

REFERENCE TO CO-PENDING APPLICATION

The subject matter of U.S. application Ser. No. 08/925,887 filed Sep. 8, 1997 entitled A METHOD OF FORMING A SUPERCONDUCTOR is incorporated herein by reference.

BACKGROUND OF THE INVENTION

1. Field of the Invention

The present invention relates to superconductor materials.

2. Description of the Related Art

Superconductor materials are gaining ever increasing attention for their ability to carry significantly large currents without resistance. Even at high frequencies well into the microwave regime and at large current levels, these materials can exhibit negligible dissipation. The so-called high temperature superconductors are especially important for many applications because they can exhibit such properties at temperatures of 77 K or higher. One promising application for these materials is in the form of epitaxially grown superconductor this films for use in wireless communication systems, both satellite and ground based.

The high temperature superconductors are generally anisotropic oxide materials. In a crystal of a typical high temperature superconductor, say $YBa_2Cu_3O_{7-\delta}$, currents are readily carried in the 'a' or 'b' crystallographic directions while the 'c' direction can only sustain a small current without significant dissipation. Many other high temperature superconductor materials are even more anisotropic. As a result, optimal current-carrying capacity in a film requires an orientation of the 'c' axis everywhere perpendicular to the substrate. This geometry enables the current to flow in the 'a' and 'b' directions only. Even with the proper alignment of the 'c' axis, the alignment of the 'a' and 'b' directions is relevant for the current-carrying capacity. In some applications, it may be preferable for the 'a' and 'b' directions to be consistent throughout the film, although for $YBa_2CU_3O_{7-\delta}$, and many other high temperature superconductors, this may lead to different properties in the 'a' and 'b' directions. Large currents can also be carried if the 'a' and 'b' directions occasionally interchange via a mechanism called "twinning". It is generally considered not desirable to have other relative orientations of the 'a' and 'b' directions in different parts of the film since these lead to large angle grain boundaries which are found to decrease the current carrying capacity of the film.

Typically, as these films are grown their outer surface tends to roughen. This can be due to particulates attaching to the film during growth or the nucleation of undesired orientations. Even if such difficulties are avoided the surface will tend to roughen as it grows and can be characterized by a series of peaks and valleys. This is usually attributed to a "spiral growth mode" known to be typical for these materials. In such films, regardless of the height of the peaks, the current is limited by the thickness in the valleys. Further, any current carried or induced near the surface of a peak must necessarily travel in the 'c' axis direction to pass through a valley.

Moreover, attempts to continue the growth process and increase the useful thickness have progressively diminishing returns thereon since the peaks tend to gain height at the expense of the valleys. In other words, the valleys do not see a commensurate increase in height.

In addition to reducing the current carrying capacity, rough films have other undesirable properties. These include increased microwave surface resistance and increased electrical noise. Such defects in the films will also make patterning the film difficult and hamper the film development of more complicated multi-layer structures on top of the superconducting film.

It is an object of the present invention to provide novel superconductors.

SUMMARY OF THE INVENTION

Briefly stated, the invention involves a method of forming a superconductor, comprising the steps of:

providing a substrate;

exposing the substrate to a first atmosphere, including precursors to form a first epitaxial layer segment, exposing the first layer segment to a second atmosphere, including precursors to form a second epitaxial layer segment, and exposing the second layer segment to a third atmosphere including precursors to form a third epitaxial layer segment, wherein each of the first and third layer segments are each formed from a superconductor material and the second layer segment is formed from a material different from the first and third layer segments, wherein the first, second and third layer segments have a collective thickness, the third layer segment having an outer surface with a roughness which is less than that of a single layer of the superconductor material with a thickness equal to the collective thickness.

In another embodiment, there is provided a composite superconductor film applied to a substrate, the film having a thickness of at least 5000 Angstroms and an outer surface having an average roughness not exceeding 250 Angstroms.

In another aspect of the present invention, there is provided a layer of superconductor materials, the layer having a current carrying capacity and an inner discontinuous epitaxial region formed in the presence of dielectric precursor materials and at a concentration so as not to substantially reduce the current carrying capacity.

BRIEF DESCRIPTION OF THE DRAWINGS

Several preferred embodiments of the present invention will now be described, by way of example only, with reference to the appended drawings in which.

FIG A is a schematic view of a pair of superconductors.

Figure 1:
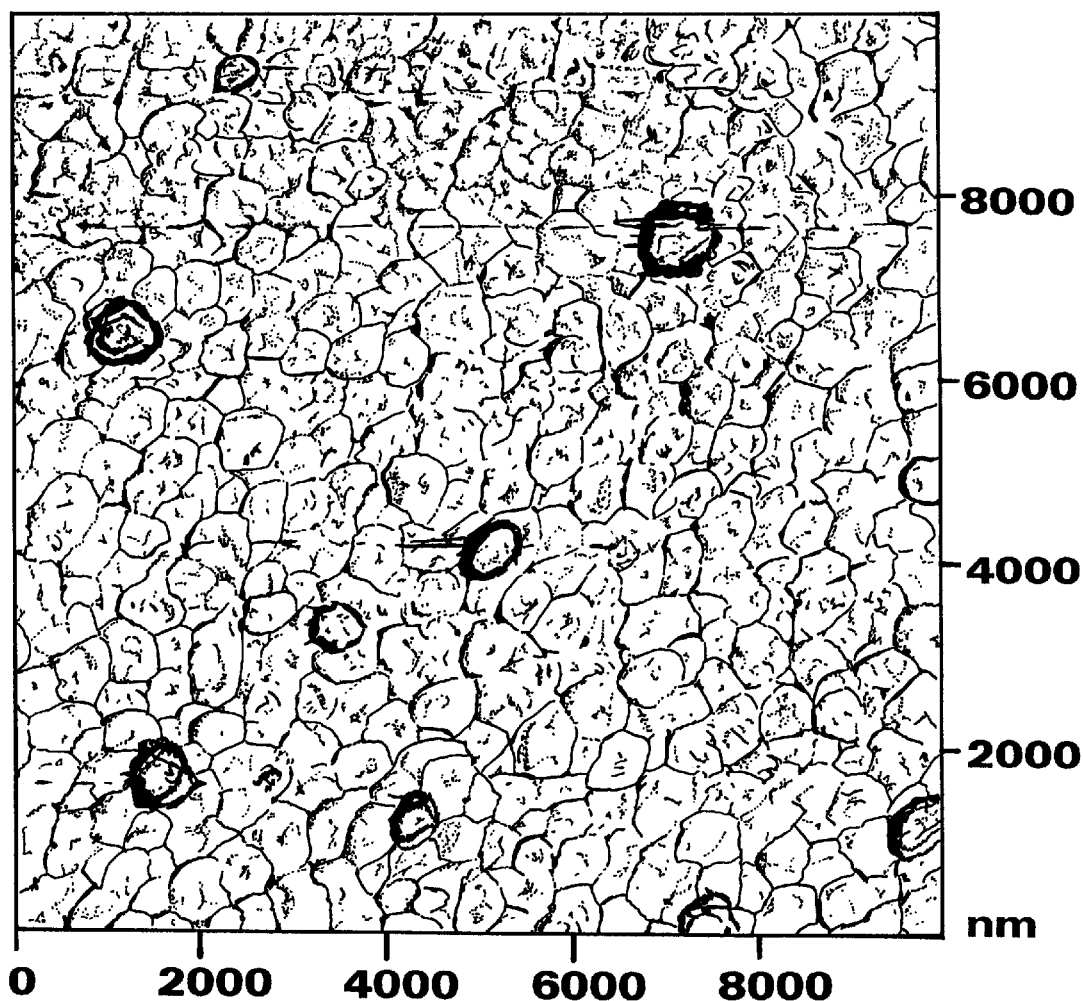
FIG. 1 is an Atomic Force Microscope (hereinafter referred to as "AFM") image of a superconductor sample (5000 Å)
Figure 2:
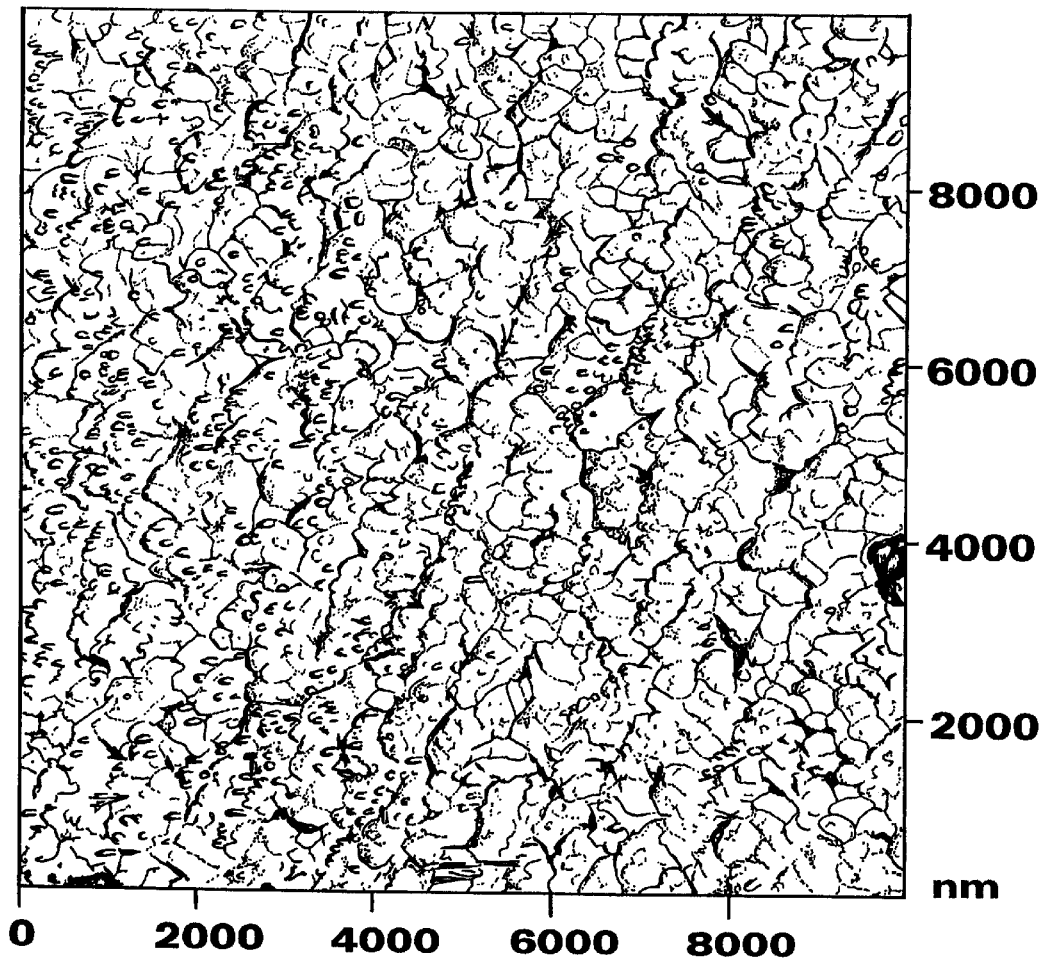
Figure 3:
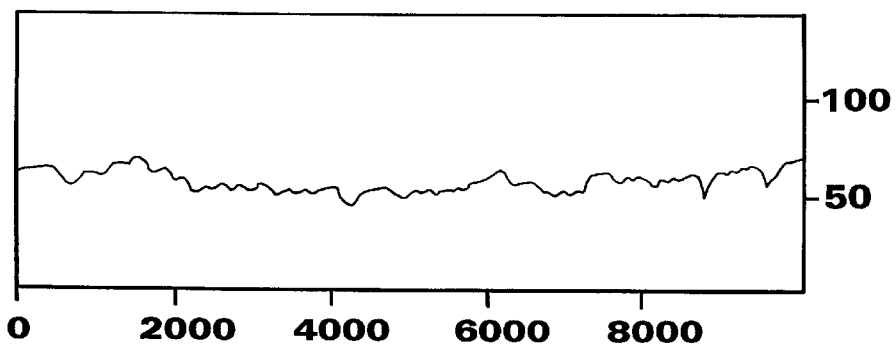
Figure 3:
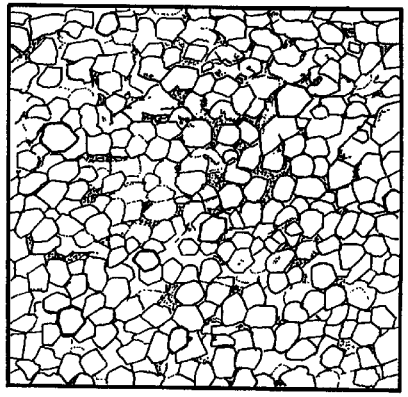
Figure 3:
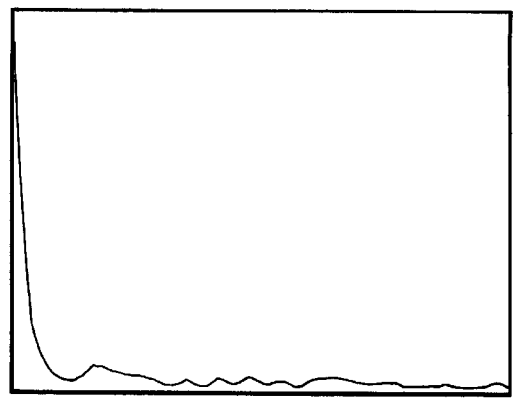
Figure 4:
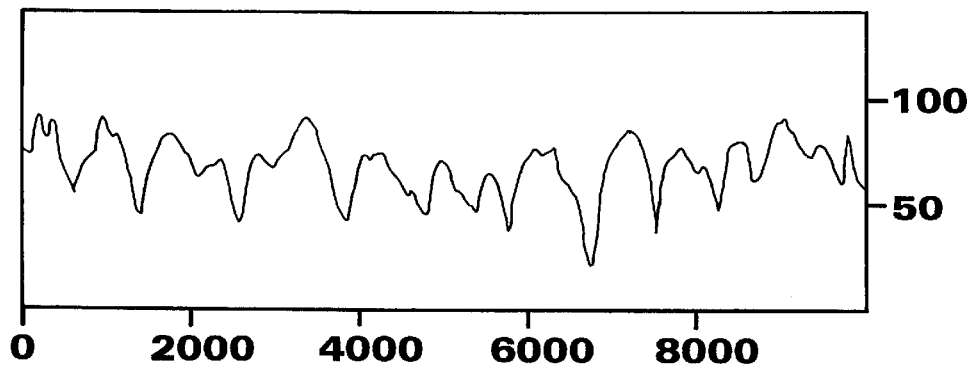
Figure 4:
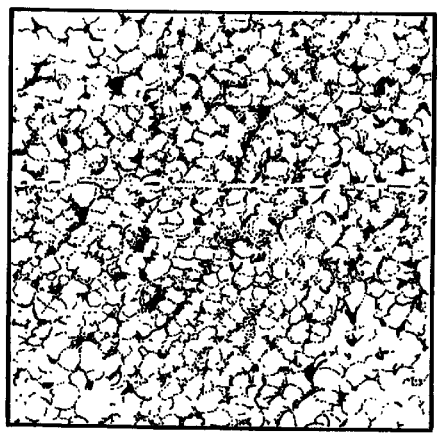
Figure 4:
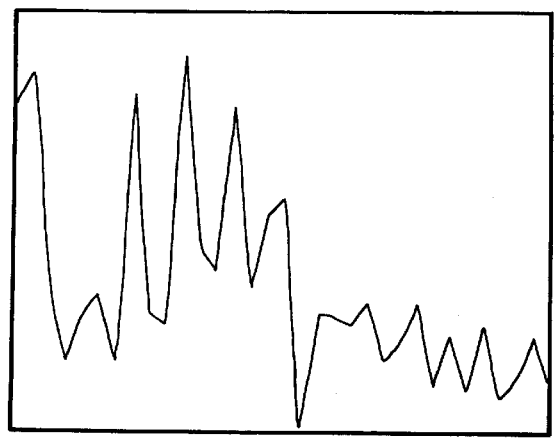
Figure 5:
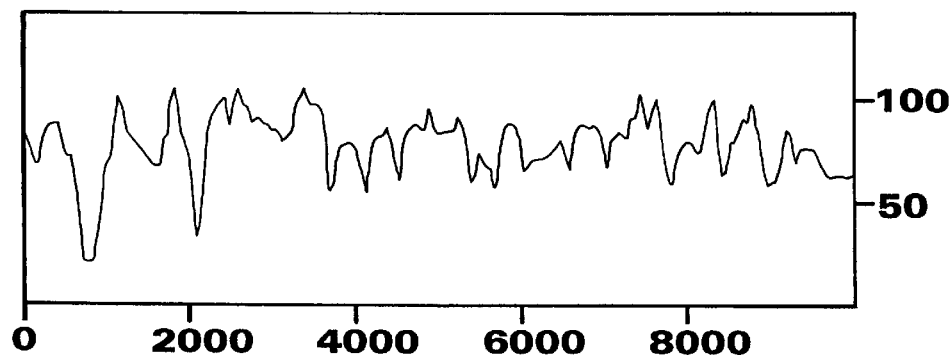
Figure 5:
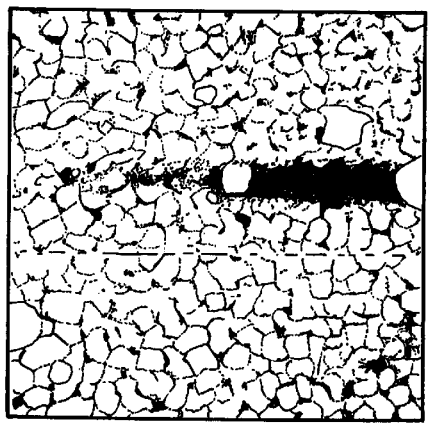
Figure 5:
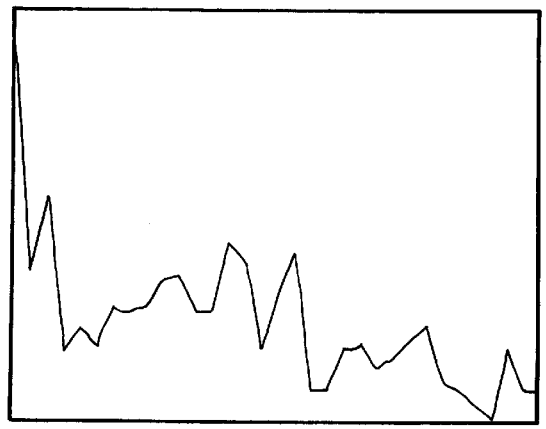
Figure 6:
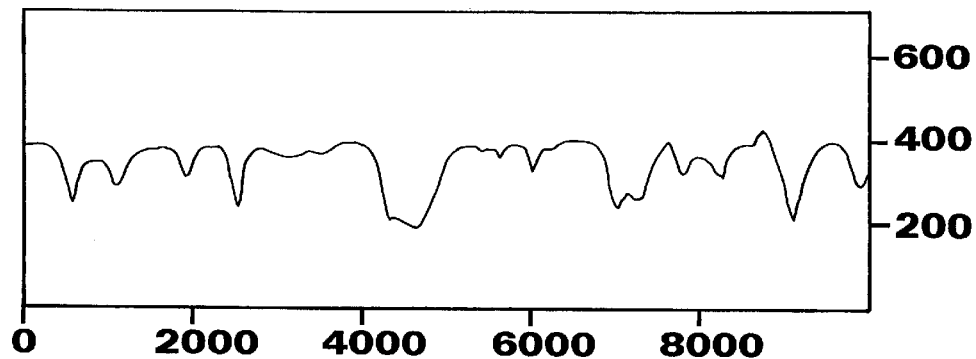
Figure 6:
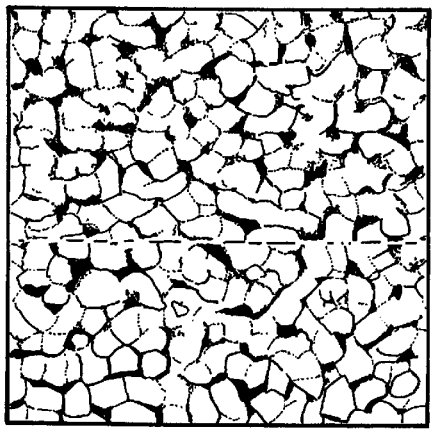
Figure 6:
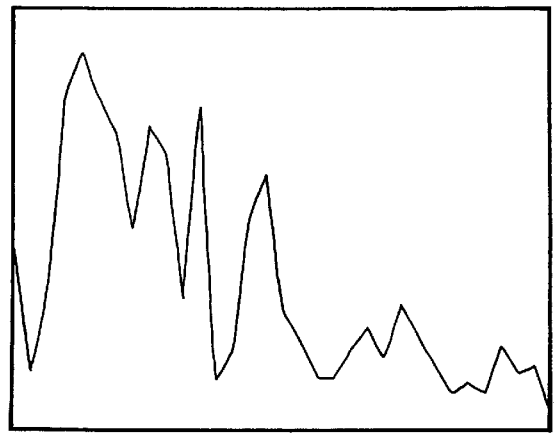

FIG. 2 is an AFM image of another sample (5000 Å);

FIG. 3 is an AFM profile of the sample shown in FIG. 1 (5000 Å);

FIG. 4 is an AFM profile of the sample shown in FIG. 2 (5000 Å);

FIG. 5 is an AFM profile of still another superconductor sample (8000 Å);

FIG. 6 is an AFM profile of yet another sample (8000 Å); and

Figure 7:
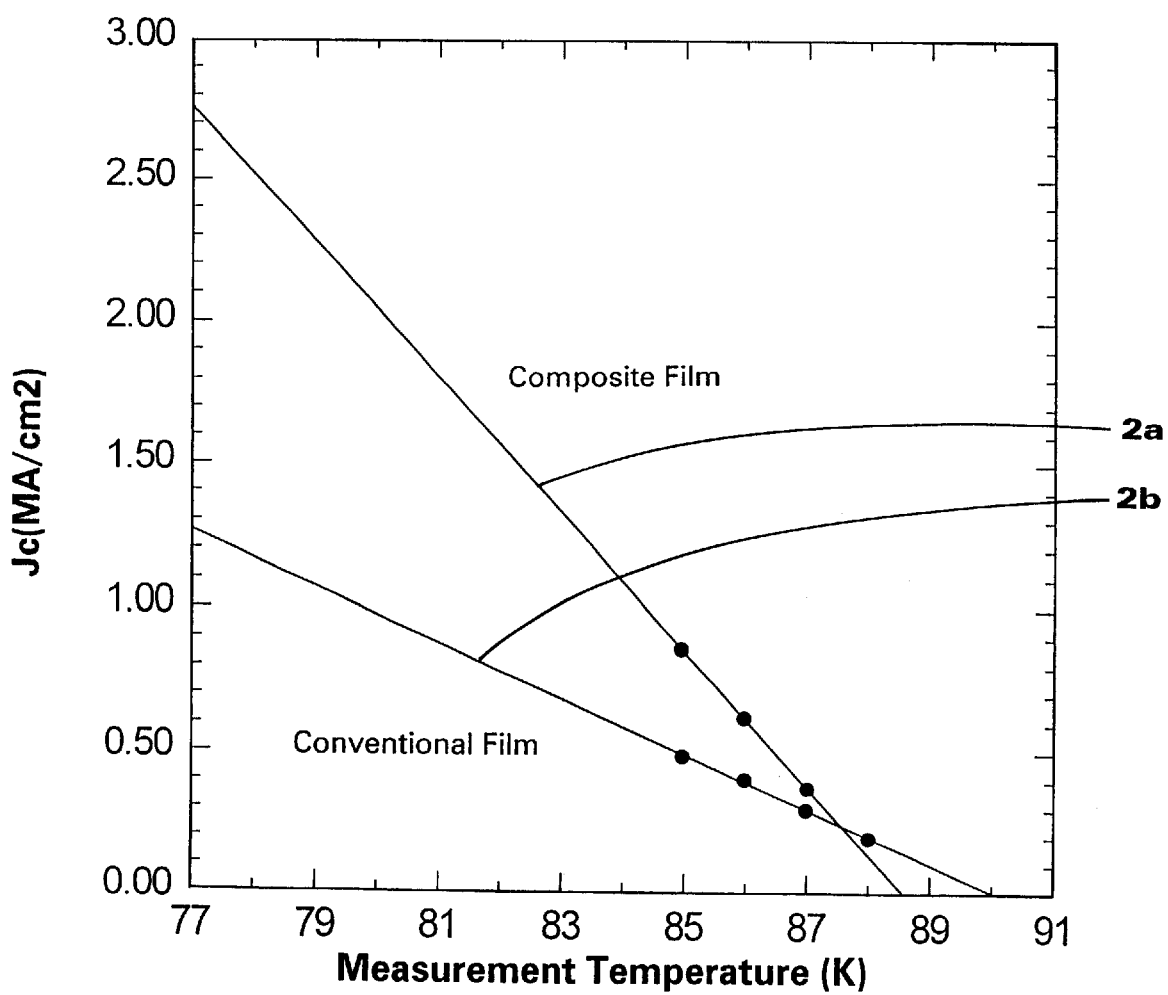

FIG. 7 is a comparative plot of critical current density versus temperature for the samples illustrated in FIGS. 5 and 6.

DESCRIPTION OF THE PREFERRED EMBODIMENTS

As will be described herein below, there is provided a method of forming a superconductor, comprising the steps of:

providing a substrate;

exposing the substrate to a first atmosphere, including precursors to form a first epitaxial layer segment, exposing the first layer segment to a second atmosphere, including precursors to form a second epitaxial layer segment, and exposing the second layer segment to a third atmosphere including precursors to form a third epitaxial layer segment, wherein each of the first and third layer segments are each formed from a superconductor material and the second layer segment is formed from a material different from the first and third layer segments, wherein the first, second and third layer segments have a collective thickness, the third layer segment having an outer surface with a roughness which is less than that of a single layer of the superconductor material with a thickness equal to the collective thickness.

In another embodiment, there is provided a composite superconductor film applied to a substrate, the thin film having a thickness of at least 5000 Angstroms and an outer surface having an average roughness not exceeding 250 Angstroms.

The term 'epitaxial' is intended to mean that the position of the atoms in each layer is substantially determined by the position of the atoms in the preceding layer. This does not preclude the possibility of occasional defects such as vacancies, pinholes, twin boundaries and dislocations that are known to occur in such systems.

The term 'layer segment' is used herein to refer to the fact that, though formed expitaxially, the individual layer segments may, for example, present themselves both optically and electrically as a single crystal thin film and therefore may have no substantially discernable features to set them apart.

The term 'film' is intended to include those generally referred to as 'thick films' and 'think films', the latter whose thicknesses usually do not exceed 5000 Angstroms.

Preferably, the second layer segment is discontinuous. In other words, the second layer segment may take the form of islands on the first layer segment, or instead have pinholes or inclusions. The first and third layer segments are formed from either the same or different oxide superconductor material and the first, second and third layer segments have a collective current density which is substantially equal to the current density of the first layer segment. More preferably, the oxide superconductor material is a high temperature superconductor, and still more preferably a copper-oxide superconductor.

The second layer segment may be formed from an oxide material, including an insulator material or a superconductor material. Preferably, the insulator material is a dielectric material selected from a group comprising $SrTiO_3$, $LaGaO_3$, $PrGaO_3$, $NdGaO_3$, $SrLaGaO_4$, $CeO_2$, $LaAlO_3$, $LaSrAlO_4$. More particularly, the dielectric material is $Ba_xSr_{1-x}TiO_3$ (hereinafter referred to as 'BSTO').

Preferably, the superconductor material is selected from the group comprising $RBa_2CU_3O_{7-8}$ wherein R is a rare earth, or a Tl-, Pb-, Bi- or Hg-based copper-oxide superconductor materials, such as for example Y-Ba-Cu-O, Bi-Sr-Ca-Cu-O, Tl-Ba-Ca-Cu-O. More particularly, the copper-oxide superconductor is $YBa_2Cu_3O_{7-8}$ (hereinafter referred to as 'YBCO').

The second layer segment may or may not cover the entire outer surface of the first layer segment. The surface of the second layer segment may or may not be smoother than the outer surface of the first layer segment. This will depend on the extent of growth of both layer segments.

In one embodiment, the first and third layer segments have a cumulative thickness and the current-carrying capacity of this cumulative thickness should be greater that the current-carrying capacity of the first layer segment and roughly proportional to the cumulative thickness. In other words, the critical current density for the first layer segment and for the cumulative thickness of the first, second and third layer segments should be substantially equal.

If desired, the growth of the third layer segment may be continued until its outer surface becomes rough. The third layer segment may then be re-exposed to a fourth atmosphere to form a fourth layer segment, and so on to provide films with arbitrary cumulative thicknesses.

In one embodiment, a first superconductor layer segment is epitaxially grown on a substrate. During this growth, the surface of the first superconductor layer segment 10 becomes relatively rough and forms a pattern of peaks and valleys. At some stage in the process, further growth becomes non-beneficial because the peaks become still higher without corresponding growth in the valleys. In this case, the first superconductor layer segment has a current carrying capacity which can be defined as some function of the current density as well as the cross sectional area of the current channel, that is the channel between the substrate and the 'lowest' valley.

It has been found that additional epitaxial growth can be carried out on the surface of the first superconductor layer segment under certain conditions so as to, in effect, 'fill in' the valleys thereon. In other words, the conditions of further epitaxial growth are selected in such a manner that the epitaxial growth occurs at a greater rate in the valleys than on the peaks. In one preferred embodiment, a second layer segment 14 of dielectric material is eppitaxially grown on the surface of the first superconductor layer segment. The presence of this dielectric layer segment is found to influence the growth of a third superconductor layer segment such that the outer surface of the third layer segment 16 is smoother that the outer surface of the first superconductor layer segment. Moreover, the surface of the third superconductor layer segment is also found to be of higher quality while the second superconductor layer segment is capable of carrying current densities equivalent to the first layer segment.

In this case, the surface of the third superconductive layer segment 16 has a roughness $r_1$ which is less than the roughness $r_2$ of a single layer of the superconductor material, as shown at 18, with the same thickness "t".

In some applications, it may be preferred to use relatively thick dielectric layer segments, such that the first and third superconductor layer segments are isolated from each other by a continuous second dielectric layer segment. However, in some instances, it is in fact desirable to have physical and electrical connections between the first and third superconductor layer segments. In one preferred embodiment, this connection may arise due to particulates in the first superconductor layer segment or pinholes in the second dielectric layer segment. In the latter case, the third superconductor layer segment is then deposited on the second dielectric layer segment in most places as well as in the pinholes, thereby making the direct connection to the first superconductor layer segment. These 'filled-in' pinholes have the effect of shorting out the adjacent superconductor layer segments through the second insulating dielectric layer segment, creating a situation in which the first and second superconducting layer segments in the composite material are thus electrically connected.

In another preferred embodiment, the second layer segment is grown to be thin enough and under suitable conditions to form 'islands' of dielectric material on the first superconductor layer segment. The third superconductor layer segment is then grown epitaxially on the second layer segment, resulting in a single composite superconducting film, that is with dielectric interstices embedded within it. Moreover, the process of introducing dielectric material between the superconductor layer segments can be repeated many times, to increase the thickness of the resulting superconducting film still further.

In yet another preferred embodiment, the second layer is of an electrically conducting oxide material. This conducting oxide may or may not be a high temperature superconductor. A second superconductor layer segment provides a significantly improved electrical continuity between the first and third superconductor layer segments provided the ambient temperature is below the critical temperature of all the superconductor materials in the film structure.

If desired, the first, second and third layer segments may be arranged to form together a signal crystal layer, with a single current carrying channel. Remarkably, this provides a substantial increase in current carrying capacity and apparently the presence of the resulting dielectric interstices do not seem to impair the current density for the material.

In one exemplified embodiment, a first layer segment of YBCO is epitaxially grown on $LaAlO_3$. A BSTO second layer segment is grown on the YBCO first layer segment and a YBCO third layer segment is then grown on the BSTO second layer segment. This procedure continues until a superconductor is achieved with the desired thickness therein.

The present technique may be applied to any of the high temperature superconductors. This includes materials selected from the group comprising $RBa_2Cu_3O_{7-\delta}$ wherein R is a rare earth, or a Tl-, Pb-, Bi- or Hg-based copper-oxide superconductor materials. The oxide material chosen may be either insulating, conducting or superconducting. However, preferred choices are insulating or superconducting to avoid increasing losses during use in microwave systems. The oxide material will typically be well lattice matched to the superconductor material in the plane of the film. The oxide material may be chosen from one of the other high temperature superconducting systems.

Embodiments of the present invention will be described with reference to the following Examples which are presented for illustrative purposes only and are not intended to limit the scope of the invention.

EXAMPLE 1

Formation of Thin Films

Several superconductor this film samples were prepared as follows:

Substrate: $LaAlO_3$, 0.5 millimeters (mm) thick, both sides polished, and purchased from LITTON-AIRTRON;

Targets: $YBa_2Cu_3O_{7-\delta}$ (YBCO): 99.999% purity, purchased from SUPERCONDUCTIVE COMPONENTS INC.

$Ba_xSr_{1-x}TiO_3$ (BSTO): 99.999% purity, (produced according to well known methods)

The samples were formed using the technique known as "Pulsed Laser Deposition" (A. W. McConnell et al. PHYSICA C225, 7(1994)), using an Excimer Laser, according to the following conditions:

Frequency: 248 nanometers (nm);
Laser Repetition Rate: 2 Hz;
Growth Rate: YBCO: 2.2 Å/sec;
BSTO 2.0 Å/sec;
Vacuum Chamber Base Pressure: $1 \times 10^{-6}$ Torr;
Oxygen pressure during growth: 225 Millitorr (mtorr);
Oxygen flow rate during growth: 2.5 SCCM;
Oxygen pressure after growth: ½ atm;
Growth temperature: 790C.;

$LaAlO_3$ substrates were attached to the surface of a furnace using a conductive gold paste. The paste was allowed to dry for at least one hour. The furnace was then placed in a growth chamber and then evacuated to a vacuum level of $1 \times 10^{-6}$ Torr. Once the 'base pressure' was achieved, the furnace was heated to the 'growth' temperature. Oxygen was then allowed to flow through the chamber at a rate of 2.5 SCCM achieving a pressure of 225 mtorr. Contaminants on the surface of both the YBCO and BSTO targets were removed by allowing the laser to vaporize its surface. A shutter was used to prevent this material from landing on the substrate. When this cleaning process was complete, the shutter was opened and the temperature was allowed to stabilize, and the first superconductor layer segment was grown. The laser was then turned off and the dielectric target was positioned in the laser beam's path. The dielectric layer was then deposited to form a second layer segment. The YBCO target was then repositioned in the laser beam's path and the third layer segment was grown. This procedure is not limited to one 'regrowth' but can be repeated a number of times depending on the number of layer segments required.

Once the growth process was complete, the chamber was filled to a pressure of ½ amosphere and the furnace was turned off. The sample cools to room temperature over a period of two hours.

The following samples were produced:

1a) YBCO 3000 Å/BSTO 300 Å/YBCO 2000 Å/$LaAlO_3$ Substrate;

1b) 5000 Å YBCO/$LaAlO_3$ Substrate;

2a) YBCO 3000 Å/BSTO 300 Å/YBCO 3000 Å/BSYO 300 Å/. . . YBCO 2000 Å/$LaAlO_3$ Substrate;

2b) 8000 Å YBCO;

The above four thin films are illustrated in the FIGS. 1 through 6.

X-ray analysis indicates that under these grown conditions, the YBCO layer segment grows in an (001) orientation (c-axis perpendicular to the substrate) and that the BSTO layer segment grows in a (100) orientation. These are the orientations needed for an epitaxial relationship between the substrate, superconductor and dielectric. The data herein indicates that the second and subsequent layer segments of superconductor or dielectric maintain an epitaxial relationship.

Comparative resistivity measurements were conducted on composite films set out in 1a, 2a and the convention YBCO films in 1b, 2b. These experiments were carried out using the well known van der Pauw technique (J. Van Der Pauw, PHILLIPS RES. REP. 13, 1 (1958)). These measurements indicate that the presence of the dielectric material interstices lowers the critical temperature slightly, by less than 2 degrees. The absolute value of the resistance measured corresponds to the total cumulative thickness of the composite films, which is believed to indicate that the different YBCO layer segments are electrically connected through the filling in of pinholes in the BSTO layer segments. It has also been noted that the density of pinholes in the BSTO layer segments can be varied via modification of the growth temperature.

The critical current for samples 2a and 2b described above was measured using a non-contact inductive technique as set out in Claussen et al. REV. SCI. INST. 62 (1991)996. Because of the thickness of the films, the measuring apparatus used herein was not able to induce currents approaching the critical current at 77K for theses films. However at higher temperatures the critical current is reduced, falling to zero at the critical temperature for the superconductor. The critical current densities for the two films at 77K were extrapolated by measurements taken at a variety of temperatures as shown in FIG. 7. For the composite film, 2a, the critical current density at 77K was estimated to be approximately $3 \times 10^6$ Amperes per square cm more than a factor of 2 greater than the value obtained for 2b.

This improvement in the critical current density for the composite film compared to the conventional film is attributed to the improved smoothness of the composite film. Atomic force microscopy measurements over a typical 10 micron strip of the film 2a indicated a film with average roughness of 98 Angstroms and maximum deviations of 1100 Angstroms. Remarkably, it appears possible to continue this process to grow very thick films. For example, a thick film has been grown using the techniques described herein with a cumulative thickness of 2 microns which has an average roughness of 140 Angstroms and maximum deviations of 1100 Angstroms.

These results demonstrate that films several microns in thickness are achievable with average roughnesses of less than 200 Angstroms. These films have an epitaxial relationship to the substrate and current densities comparable to high quality thin films. To illustrate, a 1 cm strip of such a film with a thickness of, say, 10 microns should in theory be capable of conducting about 3000 Amperes without significant dissipation at a temperature of 77 K.

The term 'Average Roughness' means the average value of the absolute deviation of a surface from a perfectly flat surface. The maximum deviations were determined by difference in height between the lowest valley and the highest peak over a typical 10 micron strip on the surface.

What is claimed is:

1. A method of forming a single composite superconducting film, comprising the steps of:
   providing a substrate;
   exposing said substrate to a first atmosphere, including precursors to form a first epitaxial layer segment,
   exposing said first layer segment to a second atmosphere, including precursors to form a second epitaxial layer segment, and
   exposing said second layer segment to a third atmosphere including precursors to form a third epitaxial layer segment,
   wherein each of said first and third layer segments are each formed from a superconductor material and said second layer segment is formed from a material different from said first and third layer segments,
   wherein said first, second and third layer segments have a collective thickness, said third layer segment having an outer surface with a roughness which is less than that of a single layer of said superconductor material with a thickness equal to said collective thickness;
   and wherein the second layer segment is configured to form a physical and electrical connection between the first and third layers, so that said first, second and third layers collectively form a single superconductive channel.

2. A method as defined in claim 1 wherein said second layer segment is discontinuous.

3. A method as defined in claim 1 wherein said first and third layer segments are formed from the same or different oxide superconductor material.

4. A method as defined in claim 3 wherein said first, second and third layer segments have a collective current density which is substantially equal to the current density of said first layer segment.

5. A method as defined in claim 3 wherein said oxide superconductor material is a high temperature superconductor.

6. A method as defined in claim 5 wherein said superconductor is a copper-oxide superconductor.

7. A method as defined in claim 2 wherein said second layer segment is formed from an oxide material.

8. A method as defined in claim 7 wherein said oxide material is an insulator material or a superconductor material.

9. A method as defined in claim 8 wherein said insulator material is a dielectric material selected from a group comprising $SrTiO_3$, $LaGaO_3$, $PrGaO_3$, $NdGaO_3$, $SrLaGaO_4$, $CeO_2$, $LaAlO_3$, $LaSrAlO_4$.

10. A method as defined in claim 1 wherein said superconductor material is selected from the group comprising $RBa_2Cu_3O_{7-\delta}$ wherein R is a rare earth, or a Tl-, Pb-, Bi- or Hg-based copper-oxide superconductor materials.

11. A method of forming a single composite superconducting film, comprising the steps of:
   providing a substrate;
   forming a first epitaxial layer segment on the substrate, and then a second epitaxial layer on the first layer, and then a third epitaxial layer on the second layer,
   wherein each of said first and third layer segments are each formed from a superconductor material and said second layer segment is formed from a material different from said first and third layer segments and provides and electrical connection between the first and third layer segments thereby to form a single composite superconductive channel which is capable of current densities up to about 3 MA/cm$^2$, and
   wherein said first, second and third layer segments have a collective thickness, said third layer segment having an outer surface with a roughness which is less than that of a single layer of said superconductor material with a thickness equal to said collective thickness.

12. A method as defined in claim 11 wherein said second layer segment is discontinuous.

13. A method as defined in claim 11 wherein said first and third layer segments are formed from the same or different oxide superconductor material.

14. A method as defined in claim 13 wherein said first, second and third layer segments have a collective current density which is substantially equal to the current density of said first layer segment.

15. A method as defined in claim 13 wherein said oxide superconductor material is a high temperature superconductor.

16. A method as defined in claim 15 wherein said superconductor is a copper-oxide superconductor.

17. A method as defined in claim 12 wherein said second layer segment is formed from an oxide material.

18. A method as defined in claim 17 wherein said oxide material is an insulator material or a superconductor material.

19. A method as defined in claim 18 wherein said insulator material is a dielectric material selected from a group comprising $SrTiO_3$, $LaGaO_3$, $PrGaO_3$, $NdGaO_3$, $SrLaGaO_4$, $CeO_2$, $LaAlO_3$, $LaSrAlO_4$.

20. A method as defined in claim 11 wherein said superconductor material is selected from the group comprising $RBa_2Cu_3O_{7-\delta}$ wherein R is a rare earth, or a Tl-, Pb-, Bi- or Hg-based copper-oxide superconductor materials.

21. A method of forming a single composite superconducting film by separating a pair of epitaxial superconductive layer segments by an intermediate epitaxial layer segment, wherein the intermediate layer segment is formed from a material different from the pair of layer segments and the intermediate layer segment provided a physical and electrical connection between the pair of layer segments, to form a single composite superconductive channel, and wherein the pair of layer segments and the intermediate layer segments have a collective thickness and the film has an outer surface whose roughness is less than that of a single layer of superconductor material with a thickness equal to said collective thickness.

22. A method of forming a single composite superconducting film by separating a pair of epitaxial superconductive layer segments by an intermediate epitaxial layer segment, wherein the intermediate layer segment is formed from a material different from the pair of layer segments and the intermediate layer segment and provides an electrical connection between the paid of layer segments, to form a single composite superconductive channel which is capable of current densities up to about 3 $MA/cm^2$, and wherein the pair of layer segments and the intermediate layer segments have a collective thickness and the film has an outer surface whose roughness is less than that of a single layer of superconductor material with a thickness equal to said collective thickness.

23. A method of forming a single composite superconducting film by separating a pair of epitaxial superconductive layer segments by an intermediate epitaxial layer segment, wherein the intermediate layer segment is formed from a material different from the pair of layer segments and wherein the intermediate layer segment is configured to form a physical and electrical connection between the pair of layer segments, so that said pair of layer segments and said intermediate layer segment collectively form a single superconductive channel, and wherein the pair of layer segments and the intermediate layer segments have a collective thickness and the film has an outer surface whose roughness is less than that of a single layer of superconductor material with a thickness equal to said collective thickness.

24. A method of forming a single composite superconducting film comprising the steps of forming a first epitaxial layer segment, forming a second epitaxial layer segment on the first layer segment and forming a third epitaxial layer segment on the second layer segment, wherein the second layer segment is formed from a material different from the pair of layer segments and wherein the second layer segment is configured to short out the first and third layer segments, whereby the first, second and third layer segments may be arranged to form together a signal crystal layer which is capable of current densities up to about 3 $MA/cm^2$, with a single current carrying channel, and wherein the first, second and third have a collective thickness and the film has an outer surface whose roughness is less than that of a single layer of superconductor material with a thickness equal to said collective thickness.

* * * * *

UNITED STATES PATENT AND TRADEMARK OFFICE
CERTIFICATE OF CORRECTION

PATENT NO. : 6,287,969 B1  
DATED : September 11, 2001  
INVENTOR(S) : Robert A. Hughes, Patrick J. Turner and John S. Preston It is certified that error appears in the above-identified patent and that said Letters Patent is hereby corrected as shown below:

<u>Title page,</u>  
Item [63], Related U.S. Application Data, should read -- Divisional Application of application serial number 08/925,887 filed September 8, 1997, and now issued to U.S. Patent 5,994,276 --;

<u>Column 1,</u>  
Line 24, "this" should be -- thin --;  
Lines 29 and 42, the last character of the formula "$_8$" should be -- $_\delta$ --;

<u>Column 3,</u>  
Line 59, the last character of the formula "$_8$" should be -- $_\delta$ --;

<u>Column 5,</u>  
Lines 35 and 56, the last character of the formula "$_8$" should be -- $_\delta$ --;  
Line 52, "this" should be -- thin --;

<u>Column 6,</u>  
Line 54, "convention" should be -- conventional --;

<u>Column 7,</u>  
Line 6, "theses" should be -- these --;

<u>Column 9,</u>  
Line 5, in the first formula, the last character of the formula "$_8$" should be -- $_\delta$ --;  
Line 12, "provided" should be -- provide --;  
Line 26, "paid" should be -- pair --.

Signed and Sealed this

Eleventh Day of May, 2004

JON W. DUDAS  
*Acting Director of the United States Patent and Trademark Office*